(12) United States Patent
Tai et al.

(10) Patent No.: US 11,251,141 B2
(45) Date of Patent: Feb. 15, 2022

(54) PACKAGE STRUCTURE

(71) Applicant: TAIWAN SEMICONDUCTOR MANUFACTURING CO., LTD., Hsinchu (TW)

(72) Inventors: Chih-Hsuan Tai, Taipei (TW); Ting-Ting Kuo, Hsinchu (TW); Yu-Chih Huang, Hsinchu (TW); Chih-Wei Lin, Hsinchu County (TW); Hsiu-Jen Lin, Hsinchu County (TW); Chih-Hua Chen, Hsinchu County (TW); Ming-Da Cheng, Taoyuan (TW); Ching-Hua Hsieh, Hsinchu (TW); Hao-Yi Tsai, Hsinchu (TW); Chung-Shi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/888,758

(22) Filed: May 31, 2020

(65) Prior Publication Data
US 2020/0294944 A1 Sep. 17, 2020

Related U.S. Application Data

(62) Division of application No. 15/726,260, filed on Oct. 5, 2017, now Pat. No. 10,672,729.
(Continued)

(51) Int. Cl.
*H01L 23/00* (2006.01)
*H01L 23/31* (2006.01)
*H01L 21/683* (2006.01)

(52) U.S. Cl.
CPC .......... *H01L 24/02* (2013.01); *H01L 21/6835* (2013.01); *H01L 21/6836* (2013.01); *H01L 23/3114* (2013.01); *H01L 23/3135* (2013.01); *H01L 24/19* (2013.01); *H01L 24/96* (2013.01); *H01L 24/97* (2013.01); *H01L 23/3128* (2013.01); *H01L 2221/6834* (2013.01);
(Continued)

(58) Field of Classification Search
CPC ......... H01L 24/02; H01L 24/19; H01L 24/96; H01L 24/97; H01L 21/6835; H01L 21/6836; H01L 23/3114; H01L 23/3135; H01L 23/3128; H01L 2221/68327; H01L 2221/6834; H01L 2221/68359; H01L 2221/68372; H01L 2224/02311; H01L 2224/02319; H01L 2224/02331; H01L 2224/02371; H01L 2224/02379; H01L 2224/02381; H01L 2224/12105
See application file for complete search history.

(56) References Cited

U.S. PATENT DOCUMENTS 5,576,517 A 11/1996 Wojnarowski
7,777,351 B1 8/2010 Berry
(Continued)

Primary Examiner — Lex H Malsawma
(74) Attorney, Agent, or Firm — Maschoff Brennan

(57) ABSTRACT

A package structure includes a semiconductor device, a molding compound, a first dielectric layer, and a through-via. The molding compound is in contact with a sidewall of the semiconductor device. The first dielectric layer is over the molding compound and the semiconductor device. The through-via is in the molding compound and the first dielectric layer. The through-via is a continuous element and in contact with the first dielectric layer.

20 Claims, 7 Drawing Sheets

Related U.S. Application Data

(60) Provisional application No. 62/479,223, filed on Mar. 30, 2017.

(52) U.S. Cl.
CPC .............. *H01L 2221/68327* (2013.01); *H01L 2221/68359* (2013.01); *H01L 2221/68372* (2013.01); *H01L 2224/02311* (2013.01); *H01L 2224/02319* (2013.01); *H01L 2224/02331* (2013.01); *H01L 2224/02371* (2013.01); *H01L 2224/02379* (2013.01); *H01L 2224/02381* (2013.01); *H01L 2224/12105* (2013.01)

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,403,674 B2 | 8/2016 | Cheng | |
| 9,496,189 B2 | 11/2016 | Yu et al. | |
| 9,704,841 B2 | 7/2017 | Kuo | |
| 9,806,055 B2 | 10/2017 | Yu | |
| 9,905,436 B2 | 2/2018 | Oh | |
| 10,163,859 B2 | 12/2018 | Yu | |
| 2008/0265383 A1 | 10/2008 | Brunnbauer | |
| 2010/0237495 A1* | 9/2010 | Pagaila | H01L 23/5283 257/700 |
| 2011/0204505 A1 | 8/2011 | Pagaila | |
| 2012/0168942 A1 | 7/2012 | Gan | |
| 2013/0037929 A1 | 2/2013 | Essig | |
| 2013/0040423 A1 | 2/2013 | Tung | |
| 2013/0119549 A1 | 5/2013 | Cheng | |
| 2013/0186676 A1* | 7/2013 | Yu | H01L 23/5389 174/257 |
| 2014/0077366 A1 | 3/2014 | Kim | |
| 2014/0138825 A1 | 5/2014 | Liu | |
| 2014/0210101 A1 | 7/2014 | Lin | |
| 2014/0252646 A1* | 9/2014 | Hung | H01L 21/486 257/774 |
| 2015/0262909 A1 | 9/2015 | Chen | |
| 2015/0325497 A1 | 11/2015 | Yu | |
| 2015/0325520 A1 | 11/2015 | Yu | |
| 2017/0125346 A1* | 5/2017 | Liu | H01L 23/5386 |
| 2019/0252296 A1 | 8/2019 | Hung | |

* cited by examiner

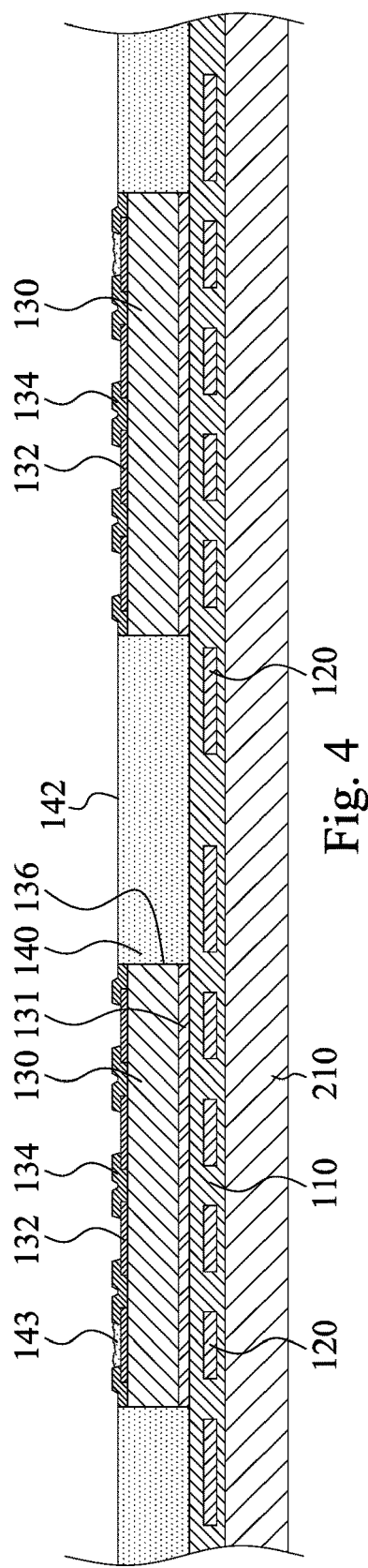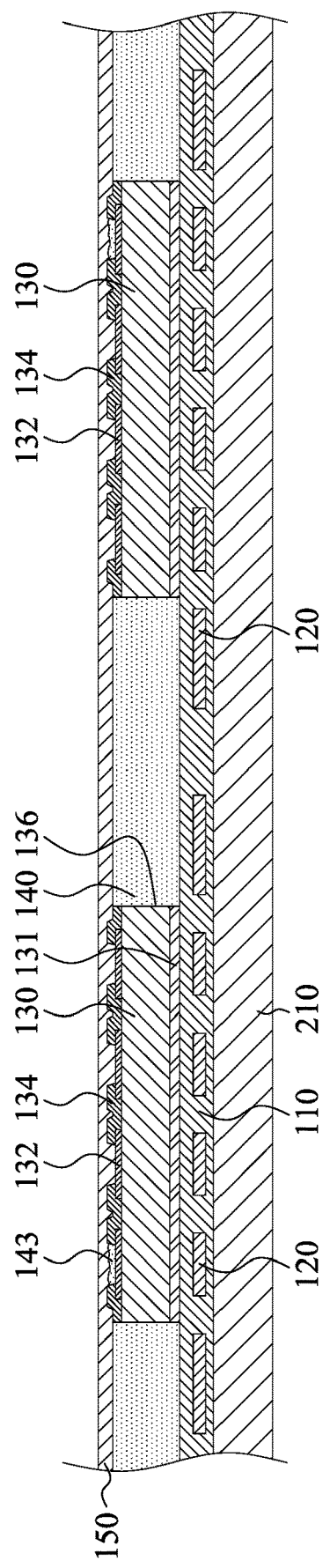

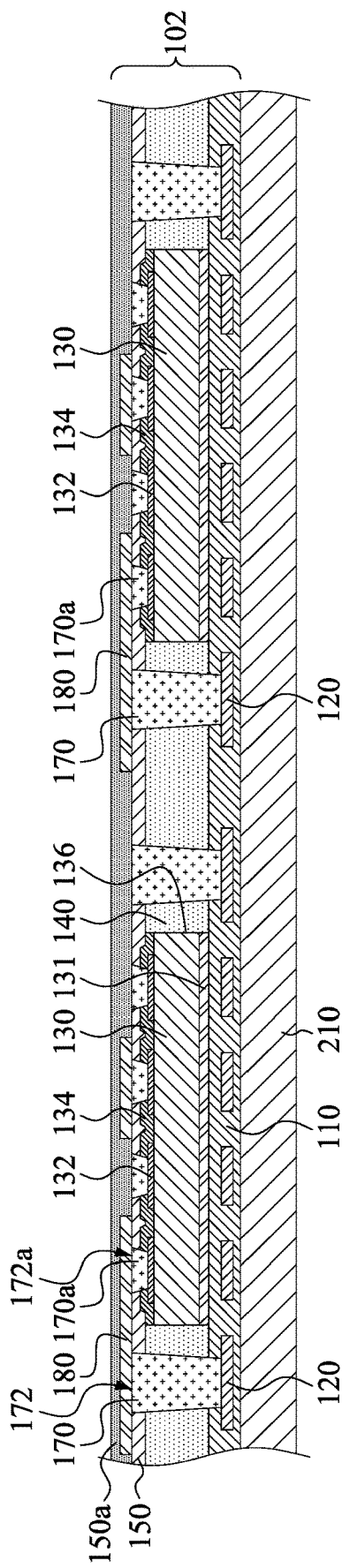
Fig. 8
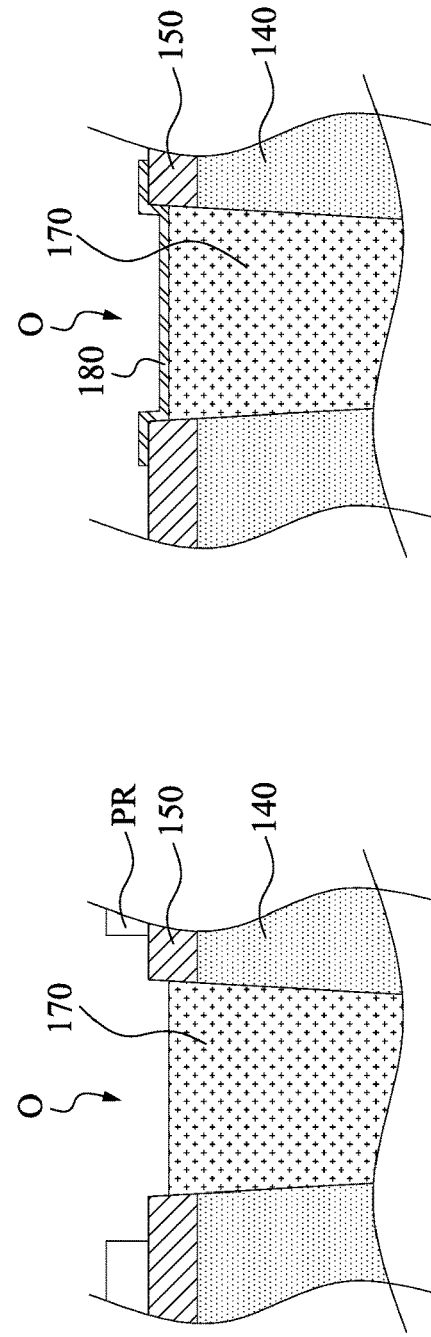
Fig. 9A
Fig. 9B

PACKAGE STRUCTURE

PRIORITY CLAIM AND CROSS-REFERENCE

This present application is a Divisional Application of U.S. patent application Ser. No. 15/726,260, filed on Oct. 5, 2017, now U.S. Pat. No. 10,672,729, issued on Jun. 2, 2020, which claims priority to U.S. Provisional Application Ser. No. 62/479,223, filed Mar. 30, 2017, which are herein incorporated by reference in their entirety.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components are also configured with smaller packages in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bond-on-trace (BOT) packages, and package on package (PoP) structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-12 are cross-sectional views of a package structure at various stages in accordance with some embodiments of the present disclosure.

DETAILED DESCRIPTION

Figure 1:
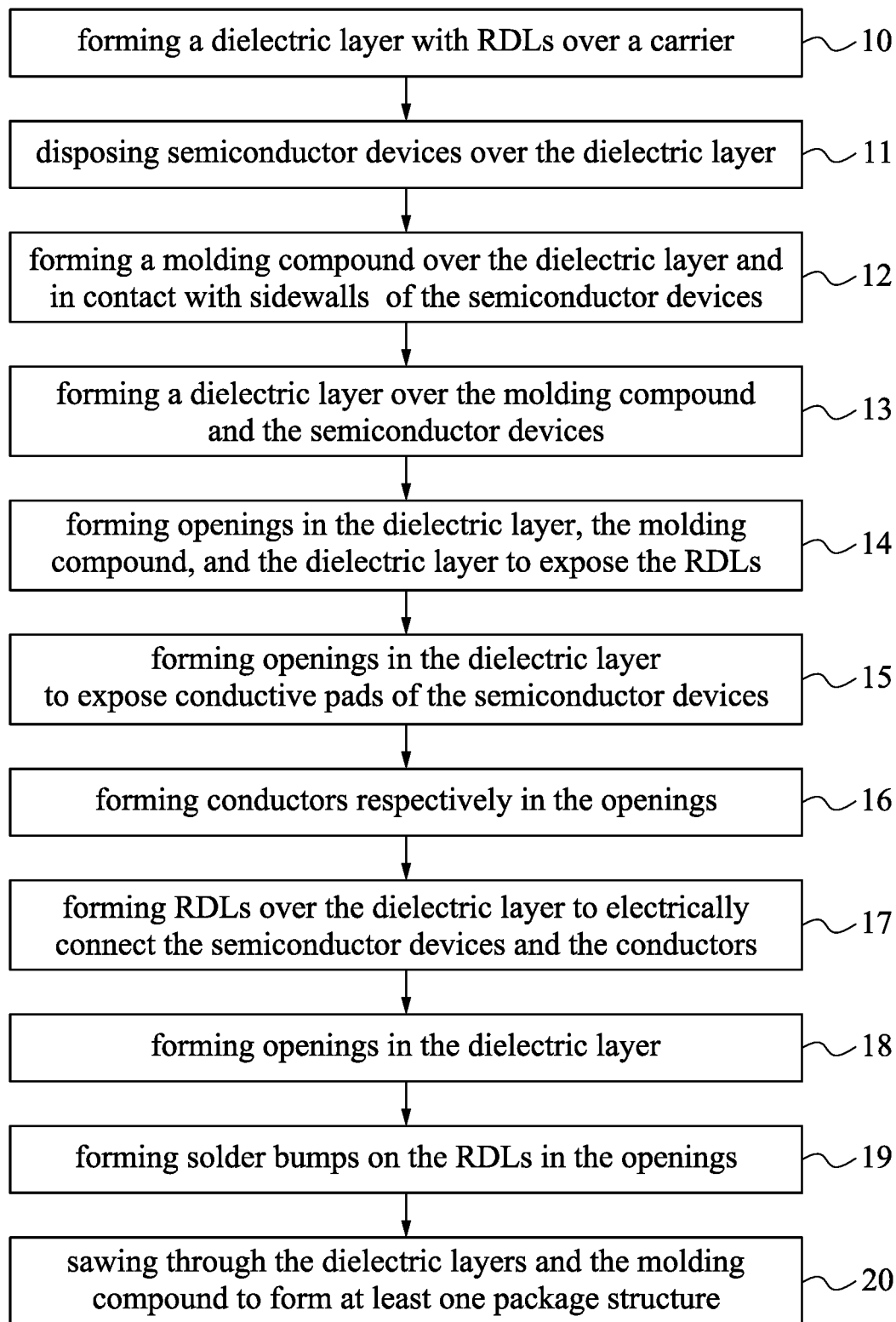
FIG. 1 is a flowchart of a method of forming a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
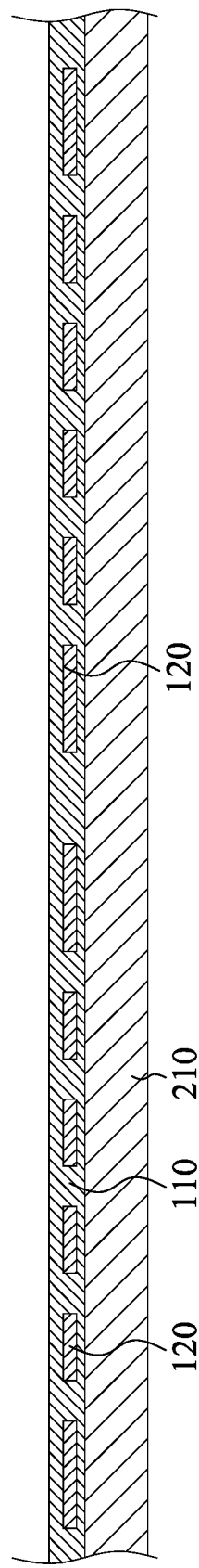
Figure 3:
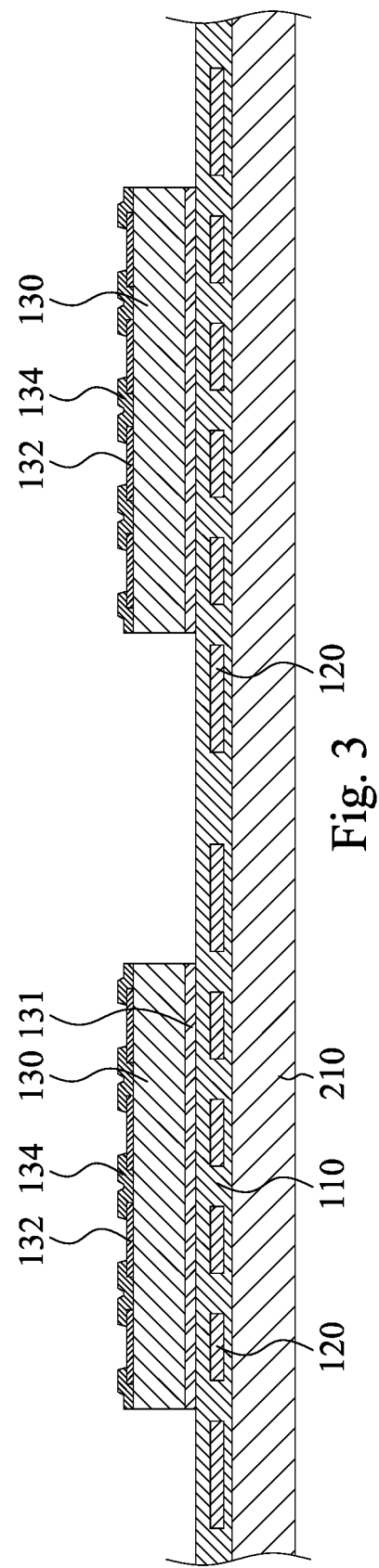
Figure 6:
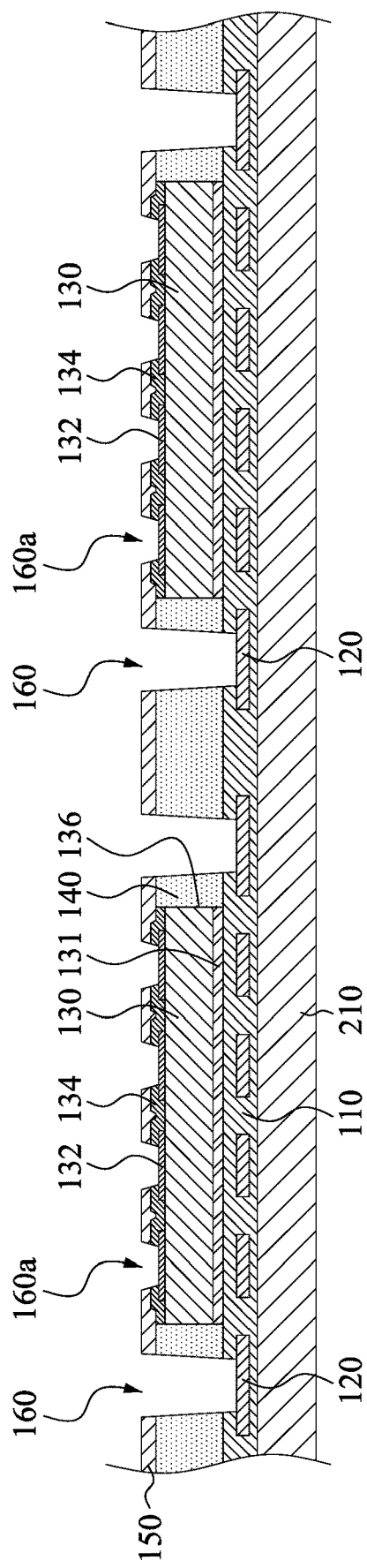
Figure 7:
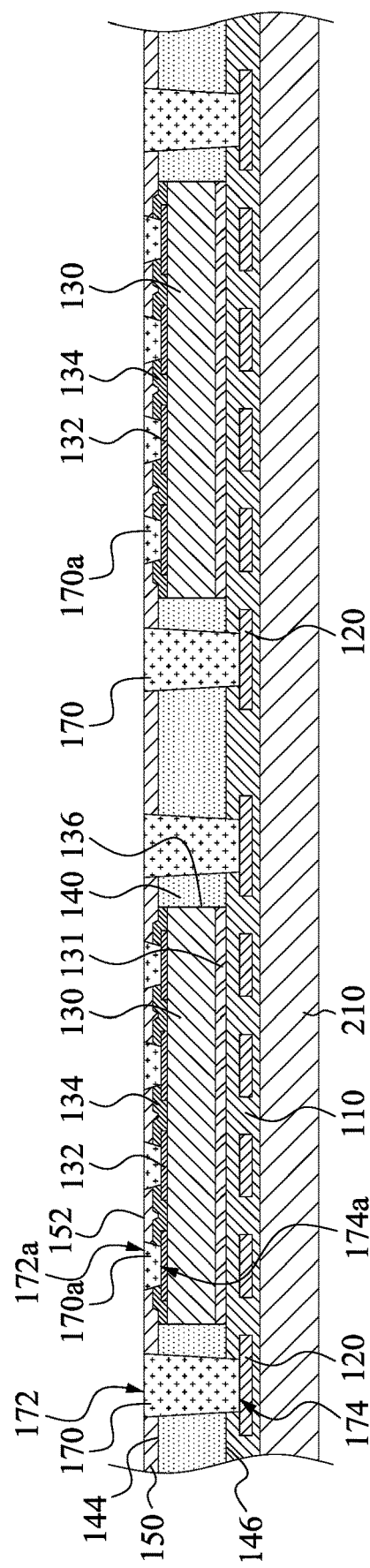
Figure 10:
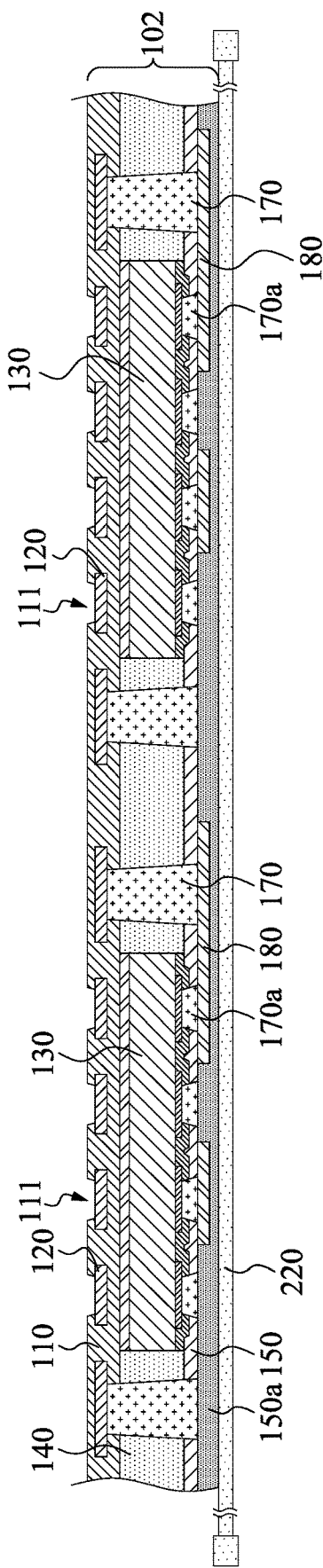
Figure 11:
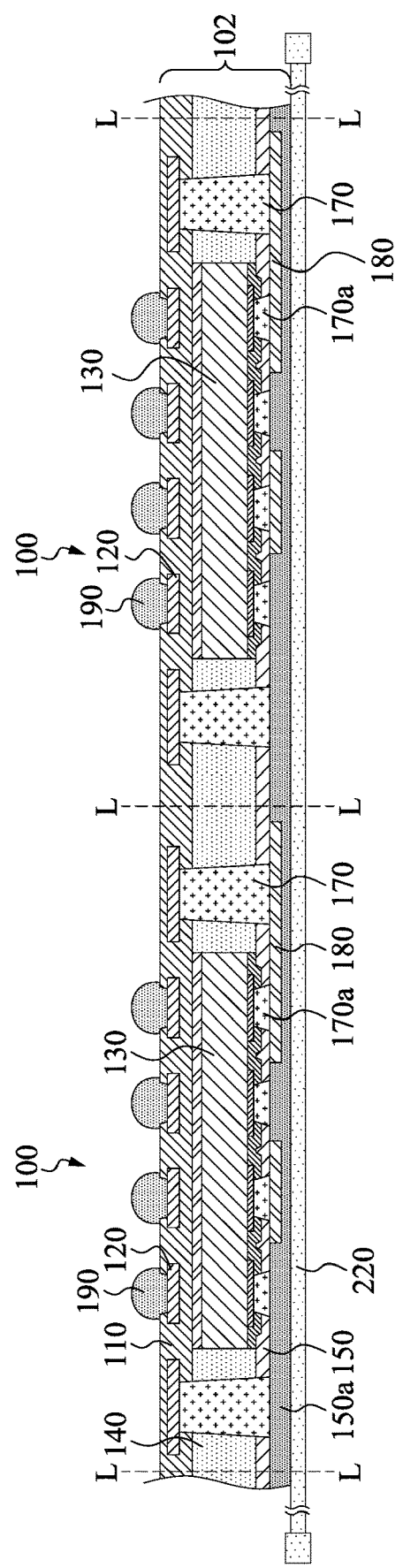
Figure 12:
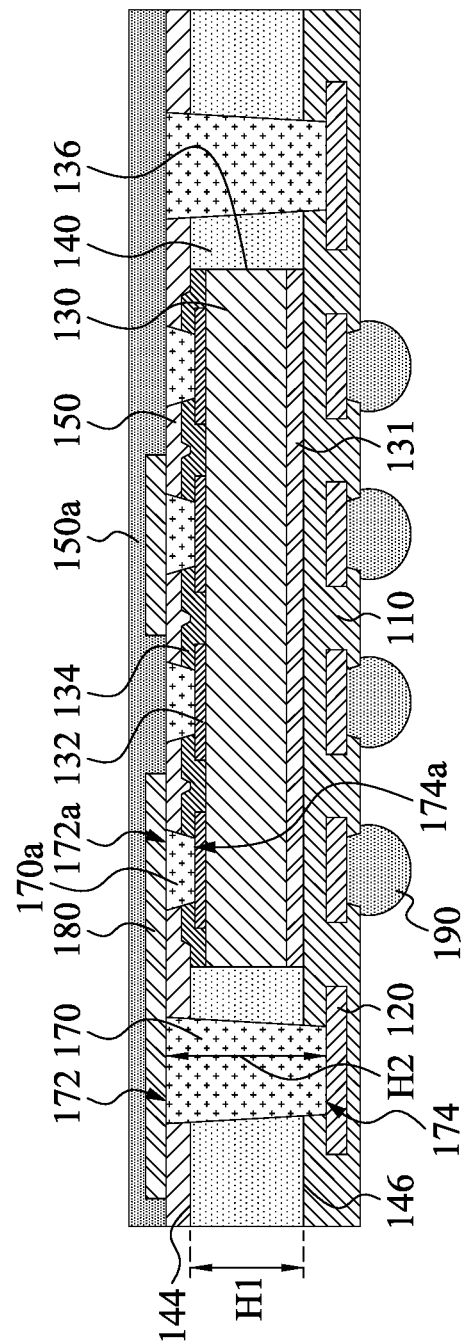

FIG. 1 is a flowchart of a method of forming a package structure in accordance with some embodiments of the present disclosure. FIGS. 2-12 are cross-sectional views of the package structure at various stages in accordance with some embodiments of the present disclosure, The method begins with block 10 in which a dielectric layer 110 with RDLs 120 is formed over a carrier 210 (as shown in FIG. 2). The method continues with block 11 in which semiconductor devices 130 are disposed over the dielectric layer 110 (as shown in FIG. 3). The method continues with block 12 in which a molding compound 140 is formed over the dielectric layer 110 and in contact with sidewalls 136 of the semiconductor devices 130 (as shown in FIG. 4). The method continues with block 13 in which a dielectric layer 150 is formed over the molding compound 140 and the semiconductor devices 130 (as shown in FIG. 5). The method continues with block 14 in which openings 160 are formed in the dielectric layer 150, the molding compound 140, and the dielectric layer 110 to expose the RDLs 120 (as shown in FIG. 6). The method continues with block 15 in which openings 160a are formed in the dielectric layer 150 to expose conductive pads 132 of the semiconductor devices 130 (as shown in FIG. 6). The method continues with block 16 in which conductors 170 and 170a are respectively formed in the openings 160 and 160a (as shown in FIG. 7). The method continues with block 17 in which RDLs 180 are formed over the dielectric layer 150 to electrically connect the semiconductor devices 130 and the conductors 170 (as shown in FIG. 8). The method continues with block 18 in which openings 111 are formed in the dielectric layer 110 (as shown in FIG. 10). The method continues with block 18 in which solder bumps 190 are formed on the RDLs 120 in the openings 111 (as shown in FIG. 11). The method continues with block 19 in which the dielectric layer 110, the molding compound 140, and the dielectric layer 150 are sawed through to form at least one package structure 100 (as shown in FIG. 12).

Referring to FIG. 2, a dielectric layer 110 having redistribution lines (RDLs) 120 therein is formed over a carrier 210. The carrier 210 may be a blank glass carrier, a blank ceramic carrier, or the like. The dielectric layer 110 may be a polymer layer. The polymer layer may include, for example, polyimide, polybenzoxazole (PBO), benzocyclobutene (BCB), an ajinomoto buildup film (ABF), a solder resist film (SR), or the like. In some embodiments, the formation of one layer of the RDLs 120 includes forming a blanket copper seed layer, forming and patterning a mask layer over the blanket copper seed layer, performing a plating to form the RDLs 120, removing the mask layer, and performing a flash etching to remove the portions of the blanket copper seed layer not covered by the RDLs 120. In alternative embodiments, the RDLs 120 are formed by depositing metal layers, patterning the metal layers, and filling gaps between the topmost one of the RDLs 120 with the dielectric layers 110.

FIG. 3 illustrates placement of semiconductor devices 130 on the dielectric layer 110. The semiconductor devices 130 may be disposed on the dielectric layer 110 through adhesive 131. The semiconductor devices 130 may be logic semiconductor devices including logic transistors therein. In some embodiments, the semiconductor devices 130 are designed for mobile applications, and may be central processing unit (CPU) dies, power management integrated circuit (PMIC) dies, transceiver (TRX) dies, or the like. Each of the semiconductor devices 130 includes a semiconductor substrate (a silicon substrate, for example) that contacts the adhesive 131. The back surface of the semiconductor device 130 (i.e., the lower surface) is in contact with the adhesive 131. The number of the semiconductor devices 130 shown in FIG. 3 is for illustration, and various embodiments of the present disclosure are not limited in this regard.

In some embodiments, conductive pads 132 are formed as the top portions of the semiconductor devices 130, and are electrically coupled to the devices such as transistors (not shown) in the semiconductor devices 130. In some embodiments, a dielectric layer 134 is formed over the top surface of the respective semiconductor device 130, with at least lower portions of the conductive pads 132 being embedded in the dielectric layer 134. The top surfaces of the conductive pads 132 may be substantially level with the top surface of the dielectric layer 134 in some embodiments (this arrangement is not shown). Alternatively, the dielectric layers 134 may not be formed, and the conductive pads 132 protrude from the respective semiconductor device 130 (this arrangement is not shown).

Referring to FIG. 4, a molding compound 140 is molded onto the dielectric layer 110 on the carrier 210. Molding material (i.e. the molding compound 140) may be a polymer, a resin, or the like. In some embodiments, molding material comprises a molding underfill, which acts as a molding compound and an underfill. Accordingly, the molding compound 140 is filled into the gap between two neighboring semiconductor devices 130, and may be in contact with, and surrounds, sidewalls 136 of the semiconductor devices 130.

In some embodiments, the molding is an expose molding, wherein the top surfaces of the semiconductor devices 130 are exposed through the molding compound 140. Furthermore, the molding may be performed using transfer molding. In some embodiments, the molding is performed using mold (not shown) to cover the top surfaces of the semiconductor devices 130. During the transfer molding, the inner space of the mold is vacuumed, and molding material is injected into the inner space of the mold to form the molding compound 140. In some embodiments, after the molding process, some molding compound residues 143 remain over the conductive pads 132 of the semiconductor devices 130.

Next, referring to FIG. 5, a dielectric layer 150 is formed over the molding compound 140 and the semiconductor devices 130, such that the molding compound 140 and the device dies 130 are between the dielectric layer 110 and the dielectric layer 150. The dielectric layer 150 may include a polymer such as polyimide, benzocyclobutene (BCB), polybenzoxazole (PBO), or the like.

Referring to FIG. 6, after the dielectric layer 150 covers the molding compound 140 and the semiconductor devices 130, openings 160 are formed in the dielectric layer 110, the molding compound 140, and the dielectric layer 150, such that portions of the RDLs 120 are exposed through the openings 160. In some embodiments, the openings 160 are formed by laser drilling. Openings 160 may taper in a direction toward the RDLs 120. For example, widths of the openings 160 decrease as the height relative to the underlying carrier 210 decreases. Since the laser drilling process can drill the dielectric layer 150 to form openings in the dielectric layer 150, a lithography process for forming openings in the dielectric layer 150 can be omitted.

In some embodiments, openings 160*a* are formed in the dielectric layer 150 to correspondingly expose the conductive pads 132 of the semiconductor devices 130. The openings 160*a* may be formed by laser drilling. The openings 160 and the openings 160*a* can be formed by two laser drilling processes with different recipes (i.e., different process parameters). When the laser drilling forms the openings 160*a* in the dielectric layer 150 to expose the conductive pads 132, the laser can remove the molding compound residues 143 on the conductive pads 132. Therefore, even if the conductive pads 132 are capped by unwanted molding residues 143, the conductive pads 132 of the semiconductor devices 130 can be exposed because the unwanted molding residues 143 can be removed by laser. In other words, the semiconductor devices 130 are free from coverage of the molding compound. The openings 160*a* may taper in a direction toward the conductive pads 132. For example, widths of the openings 160*a* decrease as the height thereof relative to the corresponding conductive pads 132 decreases. The openings 160*a* may be formed after the formation of the openings 160. In alternative embodiments, the openings 160*a* may be formed before the formation of the openings 160, and various embodiments of the present disclosure are not limited in this regard.

Referring to FIG. 7, after the openings 160 and 160*a* are formed, conductors 170 and 170*a* are formed in the openings 160 and 160*a*. In some embodiments, the conductors 170 and 170*a* may be formed by a metal-paste printing process. For example, a stencil (not shown) can be placed over the dielectric layer 150, with through-holes of the stencil being aligned to the openings 160, 160*a*. Conductive paste is then applied on the stencil. Excess conductive paste is then wiped out using a squeegee. A curing process is then applied so that the conductive paste may coalesce into conductors 170 and 170*a* in the openings 160 and 160*a*. The conductive paste forming the conductors 170, 170*a* may include metal particles mixed with an adhesive. For example, the adhesive may include phenolic resin, epoxy resin, or the like. The metal particles may include particles of a pure metal, a metal alloy, or the like. In some embodiments, the conductive paste is a copper paste. That is, the conductors 170, 170*a* are made of the same conductive material, such as copper. In alternative embodiments, aluminum paste, nickel paste, or the like may be also used to form the conductors 170, 170*a*. The conductors 170 penetrate through the molding compound 140, and each has two opposite ends 172, 174 respectively protruding from two opposite surfaces 144, 146 of the molding compound 140. In other words, the top ends 172 of the conductors 170 are higher than the top surface 144 of the molding compound 140, and the bottom ends 174 of the conductors 170 are lower than the bottom surface 146 of the molding compound 140. In embodiments where the openings 160 taper in a direction toward the RDLs 120, the conductors 170 taper in the direction toward the RDLs 120 as well. For example, widths of the conductors 170 decrease as the height relative to the carrier 210 decreases.

Moreover, the conductors 170 are in contact with the exposed portions of the RDLs 120, and hence the RDLs 120 are electrically connected to the conductors 170. The conductors 170 are made of conductive material, and at least lower portions of the openings 160 may be filled with the conductive material. For example, the conductors 170 may be copper pillars in the openings 160. The conductors 170 can act as integrated fan-out vias (TIVs), and top cross-sections of the conductors 170 may be in the shape of rectangles, squares, circles, or the like. The number of the conductors 170 shown in FIG. 7 is for illustration, and various embodiments of the present disclosure are not limited in this regard.

The conductors 170a may taper in a direction toward the conductive pads 132. For example, widths of the conductors 170a are gradually increased from the bottom ends 174a of the conductors 170a to the top ends 172a of the conductors 170a. In some embodiments, the top ends 172 of the conductors 170 and the top ends 172a of the conductors 170a are substantially at the same horizontal level. The conductors 170a are made of conductive material, and at least lower portions of the openings 160a may be filled with the conductive material. Moreover, the conductors 170a are in contact with the exposed portions of the conductive pads 132 that are in the openings 160a, and hence the conductors 170a are electrically connected to the semiconductor devices 130. The number of the conductors 170a shown in FIG. 7 is for illustration, and various embodiments of the present disclosure are not limited in this regard.

The conductors 170 and the conductors 170a can be simultaneously formed by the same metal-paste printing process in some embodiments. In some other embodiments, the conductors 170a may be formed after the formation of the conductors 170 or before the formation of the conductors 170, and various embodiments of the present disclosure are not limited in this regard.

In some embodiments, the top ends 172 of the conductors 170 and top ends 172a of the conductors 170a are substantially level (coplanar) with or slightly lower than the top surface 152 of the dielectric layer 150. As a result, the top surface 152 of the dielectric layer 150, the top ends 172 of the conductors 170, and the top ends 172a of the conductors 170a form a substantially flat surface. If the molding compound is formed after formation of the TIVs in a conventional process, a wavy topography would be formed due to shrinkage of the molding compound. However, since the conductors (TIVs) 170, the molding compound 140 and the dielectric layer 150 formed by steps as shown in FIGS. 4-7 collectively form a substantially flat surface, the topography control can be improved.

Next, referring to FIG. 8, RDLs 180 are formed over the dielectric layer 150 to electrically connect to the conductors 170 and the conductors 170a. As a result, the conductors 170 are electrically connected to the semiconductor devices 130 through the RDLs 180. In accordance with various embodiments, one or a plurality of the dielectric layers 150a are formed over the semiconductor devices 130, the molding compound 140 and the conductors 170, with the RDLs 180 formed in the dielectric layers 150a. In some embodiments, the formation of one layer of the RDLs 180 includes forming a blanket copper seed layer, forming and patterning a mask layer over the blanket copper seed layer, performing a plating to form the RDLs 180, removing the mask layer, and performing a flash etching to remove the portions of the blanket copper seed layer not covered by the RDLs 180. In alternative embodiments, the RDLs 180 are formed by depositing metal layers, patterning the metal layers, and filling gaps between the RDLs 180 with the dielectric layer 150a. The RDLs 180 may include a metal or a metal alloy including aluminum, copper, tungsten, and/or alloys thereof. Throughout the description, the combined structure including the dielectric layer 110, the semiconductor devices 130, the conductors 170, the molding compound 140, the RDLs 180, and the dielectric layers 150, 150a is referred to as a TIV package 102, which may be a composite wafer.

FIG. 8 illustrates one layer of the RDLs 180, while there may be one or more than one layer of the RDLs, depending on the routing design of the respective package. The dielectric layer 150a in these embodiments may include a polymer such as polyimide, benzocyclobutene (BCB), polybenzoxazole (PBO), or the like.

Alternatively, the dielectric layers 150a may include non-organic dielectric materials such as silicon oxide, silicon nitride, silicon carbide, silicon oxynitride, or the like.

FIGS. 9A and 9B illustrate intermediate stages of forming a layer of the RDLs 180. As illustrated in FIG. 9A, a photoresist PR is formed over the dielectric layer 150, the photoresist PR is then patterned to form openings O to expose the conductors 170 using suitable lithography techniques. Afterwards, a metal feature can be formed in the openings O to serve as the layer of the RDLs 180, and then the photoresist PR can be removed, as illustrated in FIG. 9B. If top surfaces of the conductors 170 are lower than a bottom surface of the dielectric layer 150, the photoresist PR would have a first portion lower than the bottom surface of the dielectric layer 150 and a second portion over a top surface of the dielectric layer 150, and therefore patterning of the photoresist PR would be a challenge because of depth of focus (DOF) and the process window derived from it. In some embodiments, since the conductors 170 are formed after formation of the dielectric layer 150, the top surfaces of the conductors 170 are higher than the bottom surface of the dielectric layer 150. Therefore, patterning of the photoresist PR is easier because the photoresist PR is comparatively even. Moreover, since the top surfaces of the conductors 170 are higher than the bottom surface of the dielectric layer 150 (as illustrated in FIG. 9B), dishing of the RDLs 180 can be diminished as well.

Next, the TIV package 100 is de-bonded from the carrier 210. As a result of the de-bonding the TIV package 100, the dielectric layer 110 is exposed. Referring to FIG. 10, the TIV package 100 is further adhered to a dicing tape 220, wherein the dielectric layer 150a faces toward, and may contact, the dicing tape 220. In some embodiments, a laminating film (not shown) is placed onto the exposed dielectric layer 110, wherein the laminating film may include SR, ABF, backside coating tape, or the like. In alternative embodiments, no laminating film is placed over the dielectric layer 110.

Furthermore, openings 111 are formed in the dielectric layer 110. In accordance with some embodiments, the openings 111 are formed through laser drill, although photolithography processes may also be used. Some of the RDLs 120 are respectively exposed through the openings 111.

Referring to FIG. 11, the solder bumps 190 are formed on the exposed portions of the RDLs 120 in the openings 111. In some embodiments, an under bump metallization (UBM) layer is optionally formed in the openings 111 and between the solder bumps 190 and the RDLs 120. The formation of the solder bumps 190 may include placing solder balls on the RDLs 120, and then reflowing the solder balls. After the solder bumps 190 are formed, a singulation process is carried out to saw through the dielectric layer 110, the molding compound 140, and the dielectric layer 150 along lines L, such that multiple chip-scale package structures 100 on the dicing tape 220 may be formed. The number of the package structures 100 shown in FIG. 11 is for illustration, and various embodiments of the present disclosure are not limited in this regard. After the sawing step, the package structures 100 may be picked from the dicing tape 220, and each of the package structures 100 includes the semiconductor device 130, the molding compound 140, and the conductor 170. The resulting structure is shown in FIG. 12.

Referring to FIG. 12, the package structure 100 includes a semiconductor device 130, a molding compound 140, dielectric layers 110 and 150, and TIVs 170. The molding compound 140 surrounds the semiconductor device 130. For example, the molding compound 140 is in contact with all sidewalls of the semiconductor device 130. The semiconductor device 130 and the molding compound 140 are between the dielectric layers 110 and 150. The TIVs 170 penetrate through the molding compound 140, and opposite portions of the TIVs 170 are respectively embedded in the dielectric layers 110 and 150. Therefore, the heights H2 of the TIVs 170 are greater than the height H1 of the molding compound 140. Moreover, the TIVs 170 are thicker than the semiconductor device 130 as well. In some embodiments, the height H2 of one of the conductors 170 may be substantially the same as a distance between the corresponding RDLs 180 and 120. Furthermore, when the package structure 100 is disposed on a printed circuit board, the solder bumps 190 are in electrical contact with the printed circuit board.

In some embodiments, one end 174 of the TIV 170 is embedded in the dielectric layer 110 and in contact with the RDL 120 in the dielectric layer 110, and hence the TIV 170 is electrically connected to the RDL 120. In some embodiments, another end 172 of the TIV 170 is embedded in the dielectric layer 150 and in contact with the RDL 180 over the dielectric layer 150, and hence the TIV 170 is electrically connected to the RDL 180. In some embodiments, one end 172a of the conductor 170a is embedded in the dielectric layer 150 and in contact with the RDL 180, and hence the conductor 170a can be electrically connected to the RDL 180. In some embodiments, another end 174a of the conductor 170a is embedded in the dielectric layer 134 and in contact with the conductive pad 132, and hence the conductor 170a is electrically connected to the semiconductor device 130 of the conductive pad 132. As a result of such a configuration, the TIVs 170 and the conductors 170a can be electrically connected by the RDLs 180, and the semiconductor device 130 is thus electrically connected to the TIVs 170.

In some embodiments, the TIVs 170 over the RDLs 120 and the conductors 170a over the conductive pads 132 taper in the same direction. This is due to the fact that the TIVs and the conductors 170a are formed in laser drilled openings with tapering profiles. For example, the TIVs 170 and the conductors 170a taper in a direction toward the dielectric layer 110.

Since the conductors 170 are formed after the formation of the dielectric layer 150, the top surfaces of the conductors 170 are higher than the bottom surface of the dielectric layer. Therefore, the photoresist PR formed over the dielectric layer 150 and the conductors 170 will not have a violent topography variation, thereby facilitating patterning of the photoresist PR. Moreover, dishing of the RDLs 180 formed over the dielectric layer 150 and the conductors 170 can be diminished as well. Moreover, the laser drilling used to realize the openings 160a can remove unwanted residues 143 of the molding compound on the conductive pads 132 as well.

According to some embodiments, a package structure includes a semiconductor device, a molding compound, a first dielectric layer, and a through-via. The molding compound is in contact with a sidewall of the semiconductor device. The first dielectric layer is over the molding compound and the semiconductor device. The through-via is in the molding compound and the first dielectric layer. The through-via is a continuous element and in contact with the first dielectric layer.

According to some embodiments, a package structure includes a semiconductor device, a molding compound, a first dielectric layer, and a through-via. The molding compound is around the semiconductor device. The first dielectric layer is over the molding compound and the semiconductor device. The through-via is in the molding compound and the first dielectric layer, and a top of the through-via is higher than a top of the molding compound and lower than a top of the first dielectric layer.

According to some embodiments, a package structure includes a semiconductor device, a molding compound around the semiconductor device, a first dielectric layer over the molding compound and the semiconductor device, and a through-via. The through-via is in the molding compound and the first dielectric layer. The molding compound has a sidewall facing the through-via, and said sidewall of the molding compound facing the through-via has an upper portion extending downward from a top of the molding compound and in contact with the through-via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor device;
   a molding compound in contact with a sidewall of the semiconductor device;
   a first dielectric layer over the molding compound and the semiconductor device;
   a through-via in the molding compound and the first dielectric layer, wherein the through-via is a continuous element and in contact with the first dielectric layer, and a top of the through-via is lower than a top of the first dielectric layer;
   a redistribution line over the first dielectric layer and the through-via, wherein the top of the through-via is lower than a bottom of the redistribution line; and
   a second dielectric layer below the molding compound, wherein a bottom of the through-via is lower than a top of the second dielectric layer and higher than a bottom of the second dielectric layer.

2. The package structure of claim 1, wherein the second dielectric layer is below the semiconductor device and in contact with a sidewall of the through-via.

3. The package structure of claim 2, wherein the sidewall of the through-via extends from the second dielectric layer to the first dielectric layer.

4. The package structure of claim 1, wherein the through-via is in contact with a sidewall of the molding compound.

5. The package structure of claim 1, wherein the top of the through-via is higher than a top surface of the semiconductor device.

6. The package structure of claim 1, wherein the bottom of the through-via is lower than a bottom surface of the semiconductor device.

7. The package structure of claim 1, wherein the top of the through-via is higher than a top surface of the molding compound.

8. The package structure of claim 1, wherein the bottom of the redistribution line is lower than the top of the first dielectric layer.

9. The package structure of claim 1, wherein the top of the through-via is higher than a bottom of the first dielectric layer.

10. The package structure of claim 1, wherein the through-via extends upwardly to the bottom of the redistribution line.

11. A package structure, comprising:
a semiconductor device;
a molding compound around the semiconductor device;
a first dielectric layer over the molding compound and the semiconductor device;
a through-via in the molding compound and the first dielectric layer, wherein a top of the through-via is higher than a top of the molding compound and lower than a top of the first dielectric layer; and
a second dielectric layer below the molding compound, wherein a bottom of the through-via is lower than a top of the second dielectric layer and higher than a bottom of the second dielectric layer.

12. The package structure of claim 11, wherein the second dielectric layer is below the semiconductor device, and the through-via has a portion in the second dielectric layer.

13. The package structure of claim 11, further comprising:
a first redistribution line in the second dielectric layer and electrically connected to the through-via.

14. The package structure of claim 13, further comprising:
a second redistribution line over the first dielectric layer and electrically connected to the through-via.

15. The package structure of claim 14, wherein the through-via is between the first redistribution line and the second redistribution line.

16. A package structure, comprising:
a semiconductor device;
a molding compound around the semiconductor device;
a first dielectric layer over the molding compound and the semiconductor device; and
a through-via in the molding compound and the first dielectric layer, wherein the molding compound has a sidewall facing the through-via, and said sidewall of the molding compound facing the through-via has an upper portion extending downward from a top of the molding compound and in contact with the through-via;
a redistribution line over the first dielectric layer and the through-via; and
a second dielectric layer below the molding compound and the through-via, wherein the through-via extends upwardly to a bottom of the redistribution line but not beyond a top of the first dielectric layer.

17. The package structure of claim 16, wherein the through-via has a height greater than a thickness of the molding compound.

18. The package structure of claim 16, wherein the through-via has a height greater than a thickness of the semiconductor device.

19. The package structure of claim 16, wherein the through-via has a top surface higher than a bottom surface of the first dielectric layer.

20. The package structure of claim 16, wherein the through-via has a bottom surface lower than a top surface of the second dielectric layer.

* * * * *